US008488802B2

(12) United States Patent
Ohashi

(10) Patent No.: US 8,488,802 B2
(45) Date of Patent: Jul. 16, 2013

(54) SOUND FIELD CONTROL DEVICE

(75) Inventor: Noriyuki Ohashi, Hamamatsu (JP)

(73) Assignee: Yamaha Corporation, Hamamatsu-shi (JP)

(*) Notice: Subject to any disclaimer, the term of this patent is extended or adjusted under 35 U.S.C. 154(b) by 371 days.

(21) Appl. No.: 12/782,607

(22) Filed: May 18, 2010

(65) Prior Publication Data

US 2010/0296658 A1 Nov. 25, 2010

(30) Foreign Application Priority Data

May 19, 2009 (JP) ................................ 2009-120792

(51) Int. Cl.
*H03G 3/00* (2006.01)

(52) U.S. Cl.
USPC .................... 381/63; 381/61; 381/56; 381/57

(58) Field of Classification Search
USPC .................................... 381/56–57, 61, 63, 17
See application file for complete search history.

(56) References Cited

U.S. PATENT DOCUMENTS

| | | | | |
|---|---|---|---|---|
| 7,369,663 | B2 * | 5/2008 | Sekine | 381/63 |
| 7,773,755 | B2 * | 8/2010 | Terauchi et al. | 381/17 |
| 8,094,827 | B2 * | 1/2012 | Baba et al. | 381/63 |
| 2008/0137875 | A1 * | 6/2008 | Zong et al. | 381/63 |
| 2009/0274309 | A1 * | 11/2009 | Pedersen | 381/56 |

FOREIGN PATENT DOCUMENTS

| | | | |
|---|---|---|---|
| EP | 1341399 | A2 | 9/2003 |
| EP | 1850638 | A2 | 10/2007 |
| JP | 08-275300 | A | 10/1996 |

OTHER PUBLICATIONS

European Search Report mailed May 28, 2013, for EP Application No. 10163247.0, six pages.

* cited by examiner

*Primary Examiner* — Disler Paul
(74) *Attorney, Agent, or Firm* — Morrison & Foerster LLP

(57) ABSTRACT

A sound field control device has an input part through which an audio signal is input. A storage part stores a first factor obtained by calculating a proportion of energy of direct sound in total energy of sound collected in an adjustment environment within a predetermined time. A sound field generation part generates a sound field effect sound from the audio signal input through the input part, and outputs the sound field effect sound at a volume corresponding to the first factor. A calculation part calculates a second factor which represents a ratio of an energy of a direct sound to an energy of sound which is collected in a reproduction environment and which contains the direct sound. A correction part corrects the volume of the sound field effect sound based on a ratio between the first factor and the second factor.

6 Claims, 7 Drawing Sheets

SOUND FIELD CONTROL DEVICE

BACKGROUND OF THE INVENTION

1. Technical Field of the Invention

The present invention relates to a sound field control device that imparts a sound field effect to an audio signal to control a sound field, and more particularly to sound field effect control according to a reproduction environment where the audio signal is reproduced.

2. Description of the Related Art

A conventional sound field control device imparts a sound field effect to sound of audio contents and controls the sound field (for example, see Japanese Patent No. 2755208). The sound field effect is an effect for reproducing sounds simulating reflected sounds generated in an acoustic space such as a concert hall to allow the listener to experience a sense of presence or reality such that the listener feels as though they were located in a different space such as a real concert hall while they are actually located in a room.

FIGS. 1(A) to 1(C) are conceptual diagrams illustrating a conventional process for localizing a virtual sound source. Specifically, FIG. 1(A) illustrates arrangement of speakers connected to a sound field control device, FIG. 1(B) illustrates an image of distribution of sound sources of direct and reflected sounds, when sounds to which a sound field effect has been imparted have been reproduced, and FIG. 1(C) is a graph illustrating an echo pattern of a hall (specifically, a graph representing the generation times and levels of direct and reflected sounds).

In the conventional sound field control device, volumes of sounds reproduced from speakers SP1 to SP5 arranged in a room H as shown in FIG. 1(A) are previously adjusted during setting or the like such that the volumes of the sounds are equal at a sound receiving point (listening position) J.

When the sound field control device is set so as to impart a sound field effect simulating a sound field of a hall, the sound field control device emits a sound as a direct sound through each speaker after or without performing a specific process on an input signal (i.e., a signal of a sound included in the content) as shown in FIG. 1(B). The sound field control device generates signals of sounds (sound field effect sounds), which simulate a plurality of reflected sounds, from the input signal based on sound field effect information of the hall, and emits the plurality of reflected sounds through the speakers as shown in FIG. 1(B). Here, the generation times and levels of the direct sound and the plurality of reflected sounds (sound field effect sounds) have, for example, a relationship as shown in FIG. 1(C).

The sound field effect information is information for reproducing sound field effect sounds. The sound field effect information includes impulse response characteristics of a group of reflected sounds generated in an acoustic space such as a concert hall or position information of respective virtual sound sources of the group of reflected sounds. In the following description, each reflected sound in an acoustic space such as a concert hall that the sound field control device generates from an input signal is referred to as a "sound field effect sound" as described above and is distinguished from each reflected sound generated through reflection of the sound from the walls of a listening room.

The conventional sound field control device has a problem in that an intended sound field effect is not obtained due to a difference in a real reproduction environment such as a difference in the direction or the arrangement of speakers within a room.

Such a difference in the sound field effect due to a difference in the reproduction environment is caused not only by a difference in the distance between the speakers and the sound receiving point but also by a difference in the size, material (or reflectivity), or the like of the room.

If the sound field effect is too strong, the sound field effect interferes with listening since the sound field effect sounds harsh. On the other hand, if the sound field effect is too weak, the practical value of the sound field effect function is reduced since it is hard to hear the sound field effect sound.

SUMMARY OF THE INVENTION

Therefore, it is an object of the invention to provide a sound field control device which can appropriately correct a difference in the degree of the sound field effect caused by a difference in the reproduction environment.

The invention includes the following components as the means for solving the above problems.

The sound field control device of the invention is a device that controls a sound field by imparting a sound field effect to an input audio signal. The sound field control device adjusts the volume of each sound field effect sound generated for imparting a sound field effect according to a reproduction environment (i.e., a place where the sound field control device is installed), taking into consideration a reflection state of sound in the reproduction environment.

The sound field control device stores sound field effect information as information for generating sound field effect sounds corresponding to reflected sounds simulating acoustics of a concert hall or the like. The sound field control device generates a plurality of sound field effect sounds based on the sound field effect information, and emits the sound field effect sounds and a direct sound based on the input signal through speakers, thereby generating a sound field desired by a listener around a listening position. The sound field effect information stored in the sound field control device is created through simulation or based on acoustic data measured in a real hall or the like.

The conventional sound field control device may fail to represent a desired sound field effect since the distance between the speakers and the listening position, the acoustics of the room, or the like vary depending on the reproduction environment. Therefore, the sound field control device of the invention comprises an input part through which an audio signal is input; a storage part that stores a first factor obtained by calculating a proportion of energy of direct sound in total energy of sound collected in an adjustment environment within a predetermined time; a sound field generation part that generates a sound field effect sound from the audio signal input through the input part and that outputs the sound field effect sound at a volume corresponding to the first factor; a calculation part that calculates a second factor which represents a ratio of an energy of a direct sound to a total energy of sound which is collected in a reproduction environment and which contains the direct sound; and a correction part that corrects the volume of the sound field effect sound based on a ratio between the first factor and the second factor.

According to this configuration, the sound field control device can correct the volumes of sound field effect sounds (i.e., sounds simulating reflected sounds generated in a music hall or the like), which are generated based on the sound field effect information, based on acoustic states in the reproduction environment, i.e., based on a result of the inspection of states of reflected sounds generated through reflection of the sound from walls in the reproduction environment and then can emit the sound field effect sounds through a plurality of speakers. Accordingly, the sound field control device can allow the reproduction environment to approximate an ideal environment, regardless of the reproduction environment, by correcting the volumes of the sound field effect sounds according to the reproduction environment.

In addition, when the ratio between the first and second factors is excessively high or low, the sound field effect sounds generated based on the sound field effect information might be different from intended ones, causing a problem that the sound field effect sounds are excessively greater or smaller than the direct sound of the input signal. In the sound field control device of the invention, the correction part sets a limit to the ratio between the first factor and the second factor when correcting the volume of the sound field effect sound. Due to this configuration, it is possible to limit the volume of the sound field effect sound within a predetermined range, thereby preventing the occurrence of such a problem.

In the sound field control device of the invention, a plurality of speakers may be connected to an output part and the first and second factors of the speakers may be different. In this case, it is possible to determine and use respective representative values of the first and second factors according to the reproduction environment. In this case, the determination part determines a representative value of the first factors and a representative value of the second factors, and the correction part corrects the volume of the sound field effect sound using the representative values. Accordingly, it is possible to suppress the amount of processing for calculation, thereby reducing calculation load or calculation time.

For example, in the case where a plurality of speakers are installed, representative values of first factors A and second factors B may be set respectively for front speakers and rear speakers. Accordingly, in a living room, it is possible to allow the sound field effect to approximate that of an ideal environment even when the listening position is near a rear speaker due to arrangement of a table or a sofa in the living room.

According to the invention, the sound field control device can allow the reproduction environment to approximate an ideal reproduction environment, regardless of the reproduction environment, by appropriately correcting a difference in the degree of the sound field effect according to the reproduction environment. This allows the listener to enjoy a sense of presence or reality through the sound field effect regardless of the installation place of the sound field control device or speakers.

DETAILED DESCRIPTION OF THE INVENTION

Figure 2:
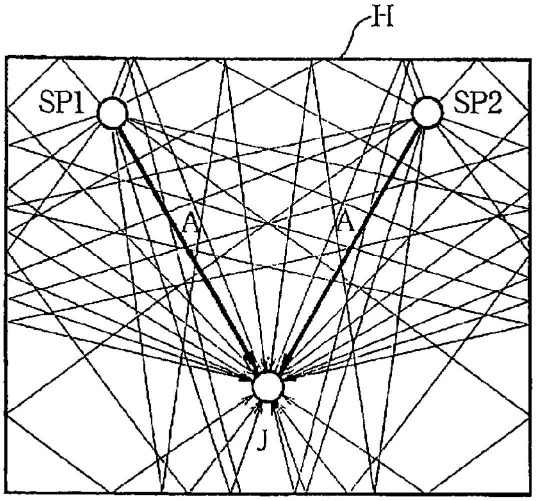
FIGS. 2(A) to 2(F) illustrate a difference in the sound field effect due to a difference in the reproduction environment.
Figure 2:
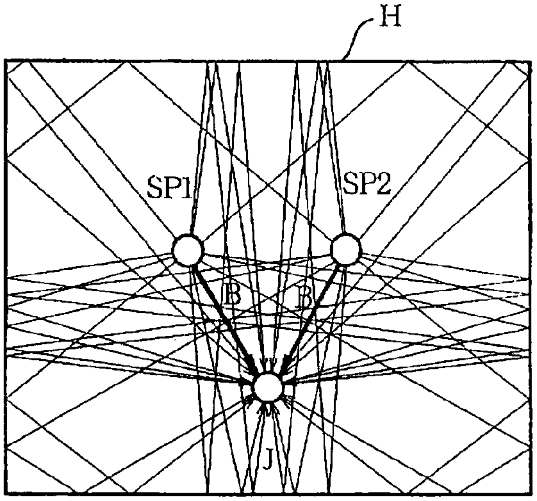
Figure 2:
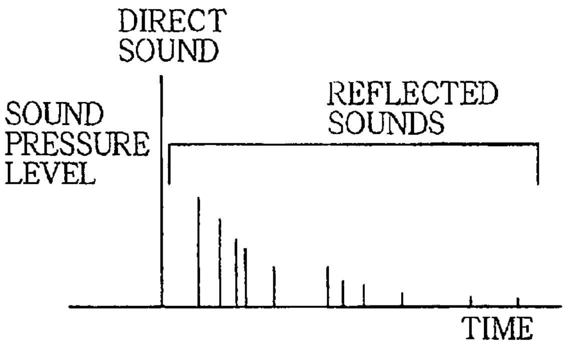
Figure 2:
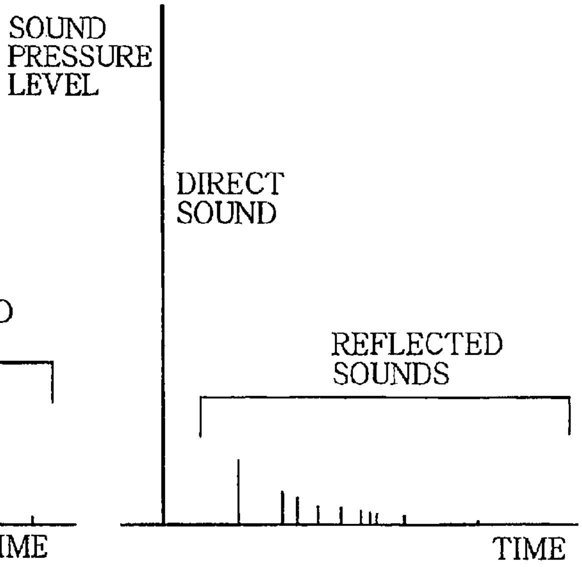

Before describing the details of the invention, first description is given as to variation in the sound field effect due to difference in the reproduction environments, for better understanding of the invention. FIGS. 2(A) to 2(F) illustrate difference in the sound field effect dependent on nature of the reproduction environments. As shown in FIG. 2(A), left and right sound sources SP1 and SP2 are installed at symmetrical positions at a distance A from a sound receiving point (listening position) J in a room H and emit sounds toward the sound receiving point J. In this case, as the sounds are emitted, a direct sound reaching directly to the sound receiving point J without reflection with walls is generated, and concurrently a plurality of reflected sounds which are reflected by walls of the room H and which arrive at the sound receiving point J are generated. A reproduction space shown in FIG. 2(A) is referred to as a "reproduction environment A".

On the other hand, as shown in FIG. 2(B), left and right sound sources SP1 and SP2 are installed at symmetrical positions at a distance B (<A) from a sound receiving point (listening position) J in a room H and emit sounds toward the sound receiving point J. In this case, as the sounds are emitted, a direct sound reaching directly to the sound receiving point J without reflection with walls is generated, and concurrently a plurality of reflected sounds which are reflected by walls of the room H at different positions from those shown in FIG. 2(A) and which arrive at the sound receiving point J are generated. A reproduction space shown in FIG. 2(B) is referred to as a "reproduction environment B".

FIG. 2(C) illustrates a relationship between the levels of a direct sound transmitted to a receiving pint directly with the sound emitted from the right sound source SP2 and reflected sounds which are generated in the room H as the sound is emitted and the times of arrival of the direct and reflected sounds at the sound receiving point J in the reproduction environment A. FIG. 2(D) illustrates the same relationship in the reproduction environment B. A volume perceived by the listener is the integral of sound pressure (i.e., the sum of energy of direct and reflected sounds) over a certain time. Therefore, in FIGS. 2(C) and 2(D), sound pressure levels have been scaled such that the total volumes in the reproduction environments A and B are equal.

While both the respective energies of the direct and reflected sounds are proportional to energy of the signal emitted from each sound source, the energy of the direct sound varies according to the distance between the sound source and the sound receiving point, and the energy of each reflected sound varies according to acoustic characteristics of the reproduction environment. In the case where only the position of each sound source has changed as in the reproduction environments A and B, the energy of the direct sound greatly changes while the energy of each reflected sound undergoes very little change. In each of the two reproduction environments, the ratio of energy between direct and reflected sounds remains the same when the energy of sound emitted from each sound source has been adjusted to equalize volumes at the sound receiving points in the two reproduction environments.

Under the condition that the volumes at the sound receiving points J in the two reproduction environments A and B are equal when the speakers SP1 and SP2 output sounds of the same power, the volume of each direct sound from the sound sources SP1 and SP2 located near the sound receiving point J (i.e., at the small distance B) is high and the volume of each direct sound from the sound sources SP1 and SP2 located distant from the sound receiving point J (i.e., at the great distance A) is low as shown in FIGS. 2(C) and 2(D). On the other hand, the volume of each reflected sound from the sound sources SP1 and SP2 located distant from the sound receiving point J (i.e., at the great distance A) is great and the volume of each reflected sound from the sound sources SP1 and SP2 located near the sound receiving point J (i.e., at the small distance B) is small as a result of the adjustment of the energy of sound emitted from each sound source to equalize the total volume at each sound receiving point. That is, the ratio between the levels of direct and reflected sounds in the reproduction environment A is small as shown in FIG. 2(C) and the ratio between the levels of direct and reflected sounds in the reproduction environment B is large as shown in FIG. 2(D). The listener perceives such different ratios between the levels of direct and reflected sounds as different acoustic atmospheres.

Figure 1:
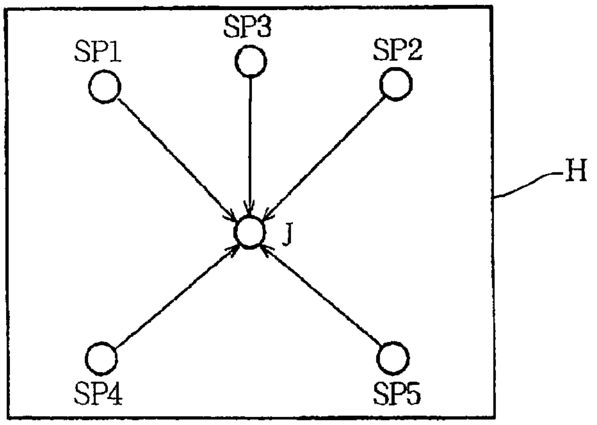
FIGS. 1(A) to 1(C) are conceptual diagrams illustrating a conventional process for localizing a virtual sound source.
Figure 1:
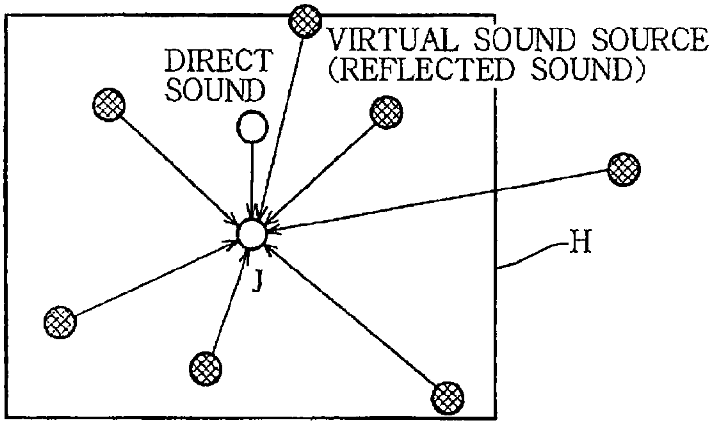
Figure 1:
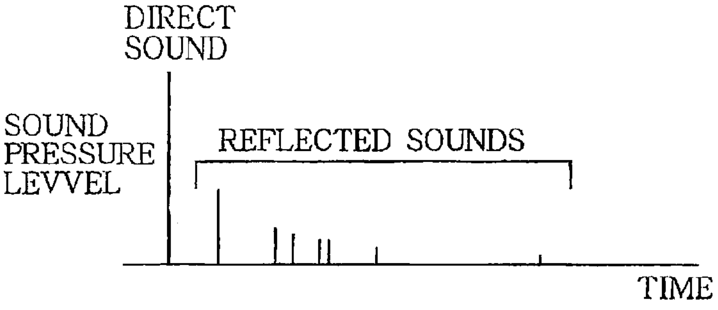
Figure 2E:
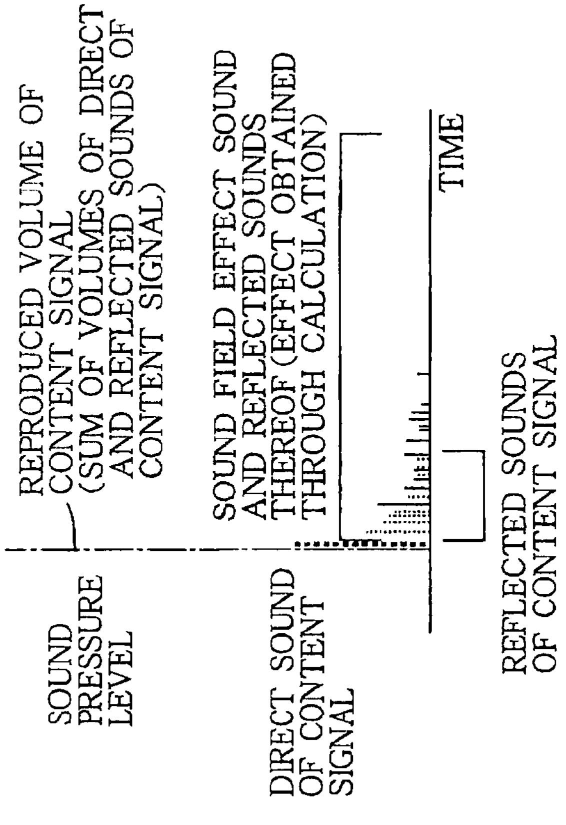
Figure 2F:
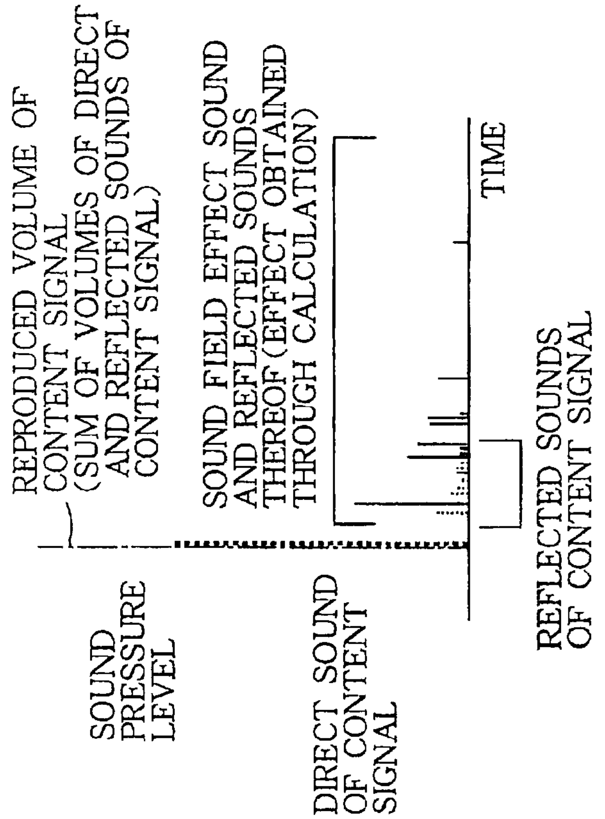

Results as shown in FIG. 2(E) (in the case of the reproduction environment A) and FIG. 2(F) (in the case of the reproduction environment A) are obtained when an audio content signal has been reproduced by selecting the echo pattern as shown in FIG. 1(C) as a sound field effect in each of the reproduction environments A and B. A direct sound transmitted directly to a receiving point and generated when the content signal has been reproduced, which will hereinafter be referred to as a "content signal direct sound", and reflected sounds generated through reflection of the sound from walls of the room when the content signal has been reproduced, which will hereinafter be referred to as "content signal reflected sounds", are shown as dotted lines, and a sound field effect sound and reflected sounds of the sound field effect sound are shown as solid lines in FIGS. 2(E) and 2(F). In addition, the reproduced volume of the content signal, which corresponds to the sum of the volumes of the direct and reflected sounds of the content signal, is shown as a dashed line at the left side of the direct sound in each of FIGS. 2(E) and 2(F) such that the reproduced volumes of the content signal are equal in both FIGS. 2(E) and 2(F).

In the reproduction environment A, the ratio between the energies of direct and reflected sounds of the content signal is small as described above. In addition, the sound pressure levels of reflected sounds of the content signal generated through reflection in the reproduction environment (i.e., in the room) are rather great compared to the sound field effect sounds as shown in FIG. 2(E). Therefore, the sound field effect sounds are masked by the reflected sounds of the content signal generated in the room, so that the listener perceives the sound field effect as being weak.

On the other hand, in the reproduction environment B, the ratio between the energies of direct and reflected sounds of the content signal is great as described above. In addition, the sound pressure levels of reflected sounds of the content signal generated through reflection in the reproduction environment (i.e., in the room) are small compared to the sound field effect sounds as shown in FIG. 2(F). Therefore, the sound field effect sounds are not masked by the reflected sounds of the content signal generated in the room, so that the listener perceives the sound field effect as being strong.

Such a difference in the sound field effect due to a difference in the reproduction environment is caused not only by a difference in the distance between the speakers and the sound receiving point but also by a difference in the size, material (or reflectivity), or the like of the room.

If the sound field effect is too strong, the sound field effect interferes with listening since the sound field effect sound becomes harsh. On the other hand, if the sound field effect is too weak, the practical value of the sound field effect function is reduced since it is hard to hear the sound field effect sound.

Therefore, the invention is directed to provide a sound field control device which can appropriately correct a difference in the degree of the sound field effect caused by a difference in the reproduction environments.

The sound field control device of the invention adjusts the volume of each sound field effect sound generated to impart a sound field effect according to a reproduction environment, taking into consideration a sound reflection condition in the reproduction environment. That is, the sound field control device measures the proportion of a direct sound in a collected sound energy in the reproduction environment. The sound field control device then corrects the proportion of a direct sound in a collected sound energy in an adjustment environment according to the proportion measured in the reproduction environment and imparts a sound field effect having the corrected proportion to an input signal. Accordingly, it is possible to adjust a difference in the degree of the sound field effect due to a difference in the reproduction environment to an appropriate effect level. The following are details of the sound field control device of the invention.

Figure 3:
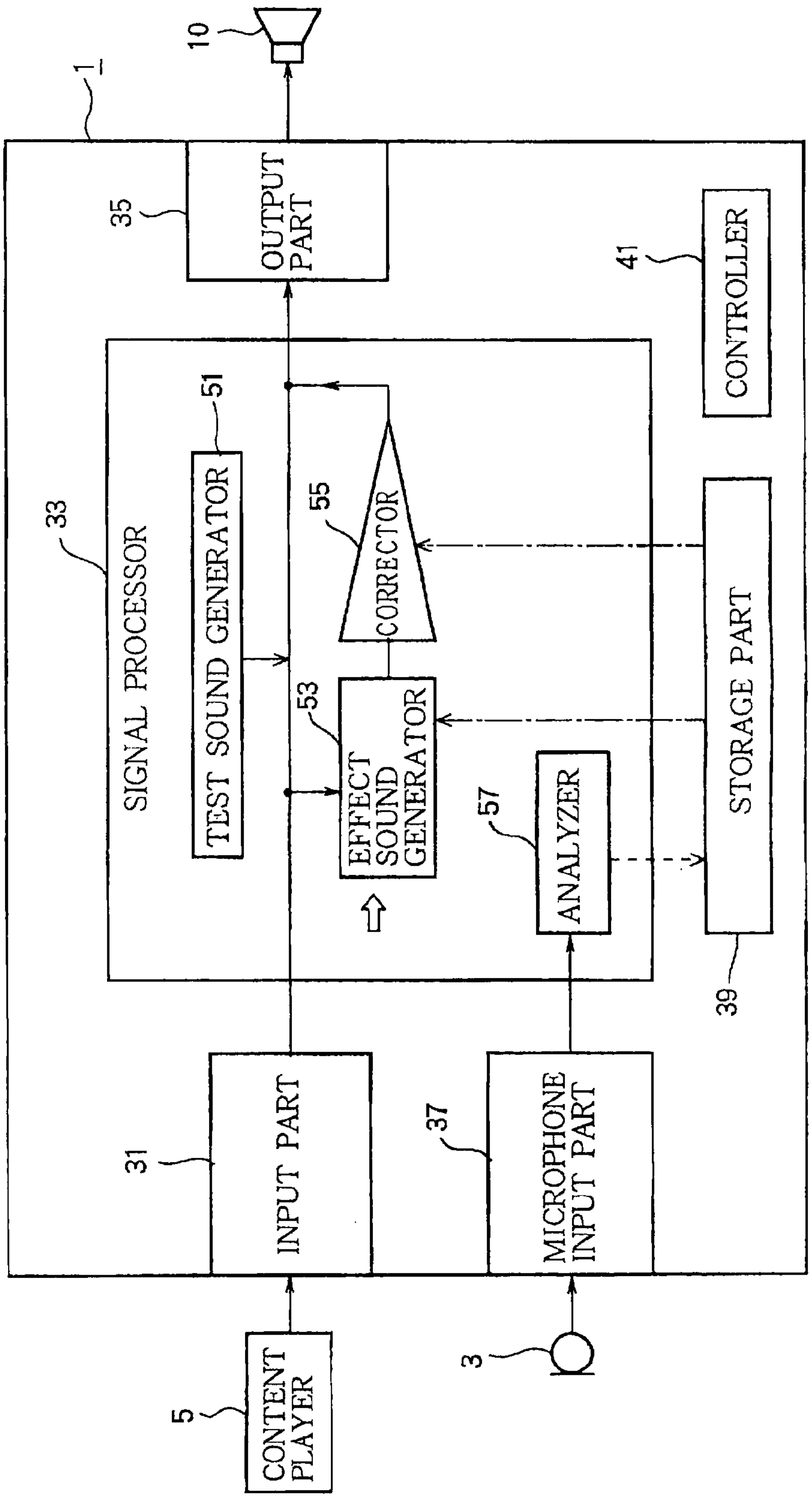
FIG. 3 is a block diagram illustrating a schematic configuration of a main portion of the sound field control device.

FIG. 3 is a block diagram illustrating a schematic configuration of a main portion of the sound field control device. The sound field control device 1 includes an input part 31, a signal processor 33, an output part 35, a microphone input part 37, a storage part 39, and a controller 41. The signal processor 33 includes a test sound generator 51, an effect sound generator 53, a corrector 55, and an analyzer 57. A microphone 3 is connected to the microphone input part 37, and an audio content player 5 (for example, a tuner or a DVD player) is connected to the input part 31. A speaker 10 is also connected to the output part 35.

When an audio signal of content output by the content player 5, which will hereinafter be referred to as a "content signal", is input through the input part 31, the sound field control device 1 performs a process such as A/D conversion or decoding on the input signal and outputs the resulting signal to the signal processor 33. The signal processor 33 outputs the content signal input through the input part 31 as a sound to the output part 35. The signal processor 33 generates sound field effect sounds corresponding to reflected sounds of a hall or the like from the content signal based on sound field effect information read from the storage part 39 and outputs the sound field effect sounds to the output part 35. The sound field effect information is information for reproducing sound field effect sounds. The sound field effect information includes impulse response characteristics of a group of reflected sounds generated in an acoustic space such as a concert hall and position information of respective virtual sound sources of the group of reflected sounds. Each reflected sound in an acoustic space such as a concert hall that the sound field control device generates from the content signal as described above is referred to as a "sound field effect sound" and is distinguished from a reflected sound generated through reflection of the reproduction sound of the content signal from the walls of the room.

The signal processor 33 corrects the amount of impartment of the sound field effect (i.e., the volume of each sound field effect sound) according to the reproduction environment.

The output part 35 performs processes such as delaying, D/A conversion, and amplification on the signal of the sound field effect sound and the sound of the content signal input from the signal processor 33 and outputs the resulting signal to the speaker 10.

The storage part 39 previously stores information of the proportion (which corresponds to a factor A as the first factor) of the direct sound in the reproduced volume (which corresponds to the sum of energy of direct and reflected sounds collected in the previous adjustment environment). This factor A is a value that has been previously set based on measurements in a previous adjustment environment (for example, an ideal reproduction environment such as an adjustment room of the manufacturer) when determining the sound field effect information.

The following method may be used to measure the proportion of the direct sound in the reproduced volume.

(1) Use of Impulse Response

The test sound generator 51 generates an impulse as a test sound signal and the test sound signal is then emitted (output)

through the speaker which is a sound source. The microphone 3 mounted at a listening position (sound receiving point) 90 collects a direct sound and reflected sounds of the test sound signal, and the analyzer 57 then analyzes the collected sounds. The proportion of the direct sound in the reproduced energy can be obtained by calculating, using the measurement results, the ratio (factor A) of energy of the direct sound of the test sound signal to total collected sound energy (volume) within a predetermined time from the output of the test sound signal output. Namely, the first factor is obtained by calculating a proportion of energy of direct sound in total energy of sound collected in an adjustment environment during a predetermined time.

(2) Use of Volume Difference Due to Microphone Position

The test sound generator 51 generates a steady sound such as white noise as a test sound signal and the test sound signal is emitted (output) through the speaker which is a sound source. The microphone 3 mounted at a listening position (sound receiving point) 90 collects a direct sound and reflected sounds of the test sound signal and the analyzer 57 then measures energy of the collected sounds. In addition, a distance between the speaker and the microphone 3 in this state is measured using a well-known method. Then, the microphone 3 is mounted at a position slightly deviated from (i.e., near) the listening position 90, and the volume and distance are measured in the same manner.

Here, when a uniform sound has been emitted in the room so that the sound has reached a steady state, it is assumed that energy due to reflected sounds in this state is equal at two near points, and the corresponding sound pressure is represented by $P_r$. In addition, it is assumed that the direct sound is attenuated in inverse proportion to the square of the distance. When $P_0$ is sound pressure at the position of the sound source, $R_1$ is the distance between the sound source and the sound receiving point at the initial position, $P_1$ is sound pressure measured at the initial position, $R_2$ is the distance between the sound source and the sound receiving point at the moved position, and $P_2$ is the sound pressure measured at the moved position, the following equations are satisfied.

$$P_1=(P_0/R_1^2)+P_r,\ P_2=(P_0/R_2^2)+P_r$$

From these equations, the proportion of the direct sound in the total energy is obtained as follows.

$$\frac{P_0}{R_1^2}\cdot\frac{1}{P_1}=\frac{R_2^2}{R_2^2-R_1^2}\cdot\frac{P_1-P_2}{P_1}$$

The proportion of the direct sound in the reproduced energy can be obtained through measurement and calculation using any of the above two methods.

The factor A can be obtained using the following equation.

$$\begin{aligned}\text{Factor } A &= \text{energy of direct sound/energy of reproduced sound in previous adjustment environment}\\ &= \text{energy of direct sound}/\left(\begin{array}{l}\text{energy of direct sound} +\\ \text{energy of reflected sounds}\end{array}\right),\end{aligned}$$

where 0<A≦1 and A=1 may be set when the goal is to realize exactly the same as virtual sound source data set in the sound field effect information. Stated otherwise, there is no reflected sound in the adjustment environment when A=1.

The factor A obtained in this manner is previously stored in the storage part 39 as described above. The storage part 39 also stores a correction factor B (described below) for correcting the volumes of the sound field effect sounds (i.e., sounds simulating reflected sounds (such as reverberation sounds) generated in a hall or the like) output by the analyzer 57. The storage part 39 also stores information such as the positional relationship or distance between the sound receiving point (the listening position) and the speaker.

The following are details of the signal processor 33.

When an environment measurement mode has been set using an operating unit (not shown), the test sound generator 51 generates and outputs a test sound to the output part 35. This test sound is a signal emitted through the speaker in order to inspect the acoustics of a place where the speaker 10 is installed (for example, the acoustics of a real reproduction environment such as a living room).

The analyzer 57, which corresponds to the calculation part, calculates the proportion of a direct sound of the test sound in the total energy of sounds collected in the reproduction environment based on signals (i.e., collected sound signals) that the microphone 3 generates by receiving the direct sound of the test sound and reflected sounds generated through reflection of the test sound from walls of the installation place and outputs the calculated correction factor B to the storage part 39 to store the correction factor in the storage part 39. Namely, the calculated proportion corresponds to the correction factor B as the second factor, Specifically, the correction factor B is calculated as follows.

$$\begin{aligned}\text{Correction factor } B &= \text{energy of direct sound/energy of reproduced sound in reproduction environment}\\ &= \text{energy of direct sound}/\left(\begin{array}{l}\text{energy of direct sound} +\\ \text{energy of reflected sounds}\end{array}\right),\end{aligned}$$

where 0<B<1.

In the reproduction environment, it is also possible to use the method of measuring the proportion of the direct sound in the reproduced volume using the impulse response or volume difference.

The effect sound generator 53, which corresponds to the sound field generation part, reads sound field effect information representing a sound field effect selected by the listener from the storage part 39 and generates a signal of an effect sound for forming a sound field.

The effect sound generator 53 may also be configured to generate a preset signal of an effect sound having a volume corresponding to the factor A for each virtual sound source, without reading sound field effect information from the storage part 39.

The corrector 55 is a correction part that reads the factor A and the correction factor B from the storage part 39 and calculates a correction value C of the volume of the effect sound from the read factors. Specifically, the correction value C is calculated as follows.

$$\text{Correction value } C=\sqrt{A/B}$$

Since both the factor A and the correction factor B represent ratios of energy (volume), the square root of A/B is calculated and converted into an amplitude in order to correct the input signal.

The corrector 55 corrects the signal of the sound field effect sound output by the effect sound generator 53 and outputs the corrected signal to the output part 35.

Figure 4A:
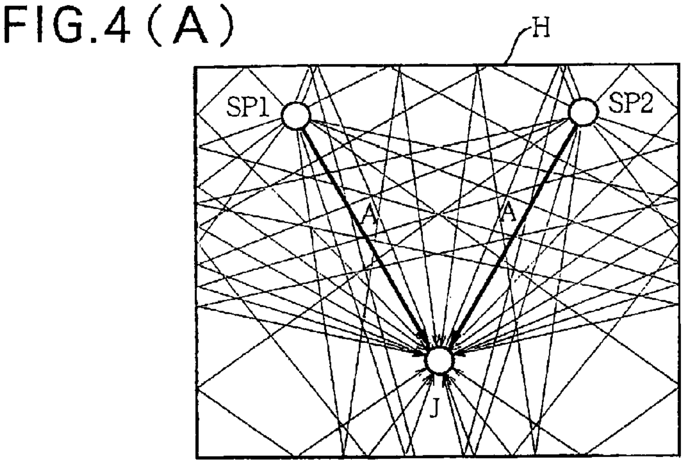
FIGS. 4(A) to 4(F) illustrate sound field effects corrected according to a difference in the reproduction environment by the sound field control device of the invention.
Figure 4B:
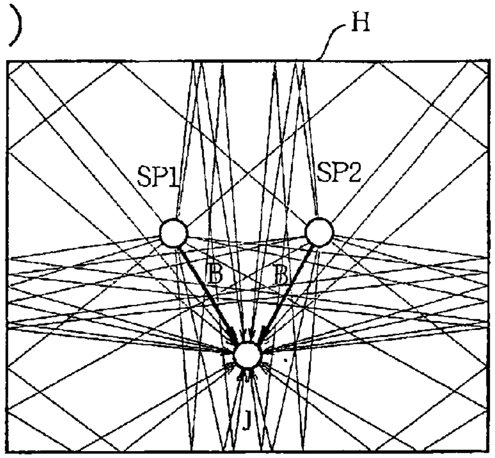
Figure 4C:
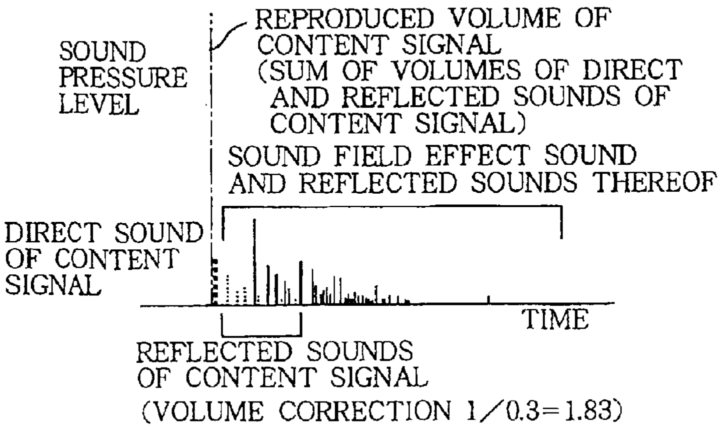
Figure 4D:
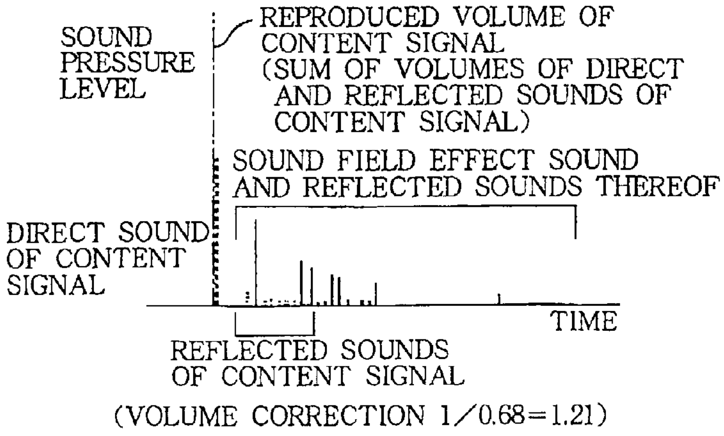
Figure 4E:
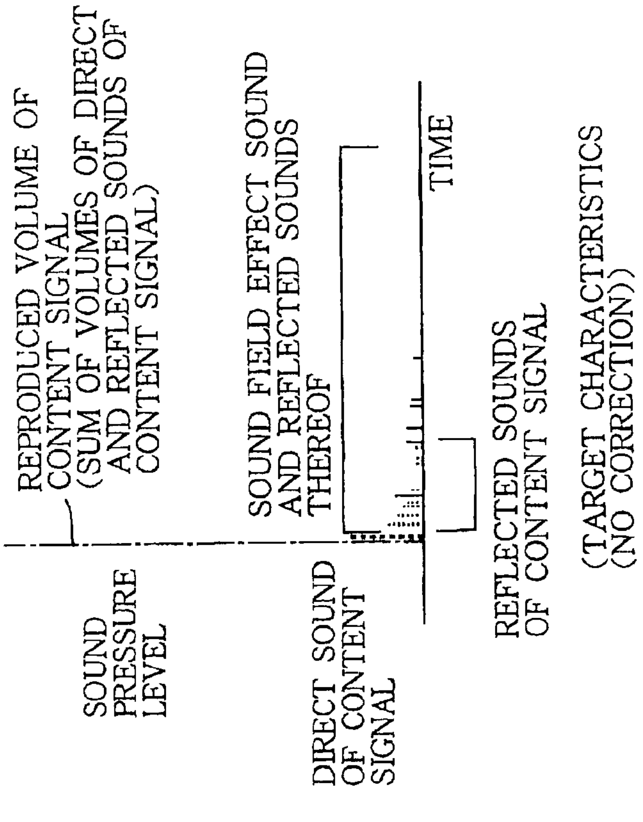
Figure 4F:
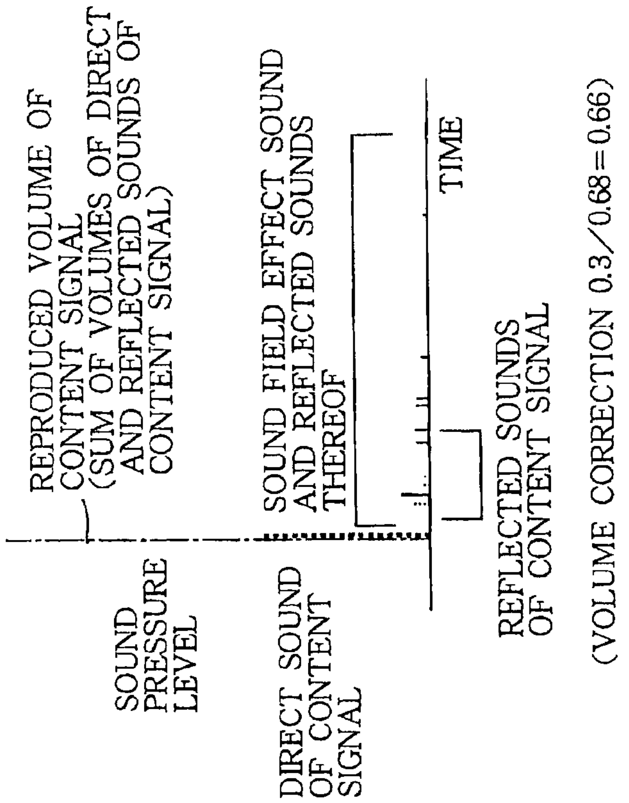

FIGS. 4(A) to 4(F) illustrate sound field effects corrected according to a difference in the reproduction environment in the sound field control device of the invention. The following description will be given with reference to an example wherein sound field effects are adjusted in the reproduction environments A and B shown in FIGS. 2(A) and 2(B). FIG. 2(A) is identical to FIG. 4(A) and FIG. 2(B) is identical to FIG. 4(B). FIGS. 4(A), 4(C), and 4(E) are drawings of the reproduction environment A and FIGS. 4(B), 4(D), and 4(F) are drawings of the reproduction environment B. In FIGS. 4(C) to 4(F), a direct sound which reached from a speaker to a receiving point directly and reflected sounds generated through reflection of the sound from walls of a room are shown as dotted lines and a sound field effect sound and reflected sounds of the sound field effect sound are shown as solid lines. In addition, in each of FIGS. 4(C) to 4(F), the reproduced volume of an input signal, which corresponds to the sum of the energy of the direct and reflected sounds of the content signal, is shown as a dashed line at the left side of the direct sound. In each of FIGS. 4(C) to 4(F), the reproduced volume of the input signal is scaled such that the reproduced volume of the input signal is shown as being equal in each drawing to equalize the volumes in both the reproduction environments A and B. This is because the volume perceived by the listener is determined based on the integral of sound pressure over a certain time, which corresponds to the sum of energy of direct and reflected sounds.

The correction factor B=0.3 is obtained in the reproduction environment A shown in FIG. 4(A), when a test sound (for example, an impulse) is emitted through a sound source SP1 or a sound source SP2 and a direct sound and reflected sounds of a content signal are collected by a microphone 3 mounted at a sound receiving point (listening position) J.

The factor A=1 is set when the goal is to realize exactly the same as virtual sound source data set in the sound field effect information. Stated otherwise, there is only direct sound and no sound is reflected. Accordingly, the correction value C of the sound field effect is calculated as follows.

$$\text{Correction value } C \text{ of sound field effect} = \sqrt{A/B} = \sqrt{1/0.3} \approx 1.83.$$

The corrector 55 can adjust the reproduced level to a level corresponding to a sound field effect suitable for the reproduction environment A by correcting each sound field effect sound for imparting a sound field effect generated by the effect sound generator 53 using the correction value C (i.e., by calculating the product of the amplitude (sound pressure level) of each virtual sound source of the sound field effect and the correction value C). For example, when the sound field effect shown in FIG. 1(C) has been imparted to the input signal, such volume correction of the sound field effect sound allows the sound pressure levels of the direct sound and the sound field effect sound of the content signal emitted through the sound source SP2 to have those of the sound receiving results shown in FIG. 4(C).

The correction factor B=0.68 is obtained in the reproduction environment B shown in FIG. 4(B), when a test sound (for example, an impulse) is emitted through a sound source SP1 or a sound source SP2 and a direct sound and reflected sounds of a content signal are collected by a microphone 3 mounted at a sound receiving point (listening position) J.

The factor A=1 is set when the goal is to realize exactly the same as virtual sound source data set in the sound field effect information. Accordingly, the correction value C of the sound field effect is calculated as follows.

$$\text{Correction value } C \text{ of sound field effect} = \sqrt{A/B} = \sqrt{1/0.68} \approx 1.21.$$

The corrector 55 can adjust the reproduced level to a level corresponding to a sound field effect suitable for the reproduction environment B by correcting each sound field effect sound using the correction value C in the same manner as described above. For example, when the sound field effect shown in FIG. 1(C) has been imparted to the input signal, such level correction of the sound field effect sound allows the levels of the direct sound and the sound field effect sound of the content signal emitted through the sound source SP2 to have those of the sound receiving results shown in FIG. 4(D).

Neither the graph of the sound receiving results in the reproduction environment A shown in FIG. 4(C) and the graph of the sound receiving results in the reproduction environment B shown in FIG. 4(D) has the original virtual sound source distribution. However, the features of the sound field effect are remarkable compared to the uncorrected conditions and it is possible to allow the reproduction environment to approximate an ideal reproduction environment, regardless of the nature of reproduction environment. That is, in the case where the proportion of the direct sound in the content signal is smaller than the proportion of the reflected sounds in the content signal as in the reproduction environment A shown in FIG. 4(A), the amount of impartment of the sound field effect sound is greater than that of the reproduction environment B (i.e., the volume correction value is greater than that of the reproduction environment B) since it is difficult to hear the sound field effect sounds (i.e., the sound field effect sounds are masked) due to the reflected sounds of the content signal that is generated in the reproduction environment A as the direct sound of the content signal is emitted.

On the other hand, in the case where the proportion of the direct sound in the content signal is greater than the proportion of the reflected sounds in the content signal as in the reproduction environment B shown in FIG. 4(B), the amount of impartment of the sound field effect sound is smaller than that of the reproduction environment A (i.e., the volume correction value is smaller than that of the reproduction environment A) since the reflected sounds of the content signal generated in the reproduction environment B are smaller than those of the reproduction environment A and thus it is easy to hear the sound field effect sound.

Next, the following calculation is performed when the sound field effect of the reproduction environment B is corrected taking the reproduction environment A shown in FIG. 4(A) as a reproduction environment having target characteristics (or desired conditions). Since the reproduction environment A has target characteristics, the correction factor B of the reproduction environment A is treated as factor A=0.3, and the correction factor B of the reproduction environment B is 0.68 as described above, a correction value C of the sound field effect is calculated based on a factor A of 0.3 and a correction factor B of 0.68. In this case, the correction value C of the sound field effect is calculated as follows.

$$\text{Correction value } C \text{ of sound field effect} = \sqrt{A/B} = \sqrt{0.03/0.68} \approx 0.66$$

The corrector 55 can adjust the effect sound level to a level corresponding to the sound field effect suitable for the reproduction environment B by correcting the sound field effect sound generated by the effect sound generator 53 using the correction value C. For example, in the case where the sound field effect shown in FIG. 1(C) in the reproduction environment A has been imparted to the input signal, the volumes of the direct sound and the sound field effect sound of the content signal emitted through the sound source SP2 are measured as shown in FIG. 4(E). On the other hand, in the case where the sound field effect shown in FIG. 1(C) in the reproduction environment B has been imparted to the input signal, the levels of the direct sound and the sound field effect sound of the content signal emitted through the sound source SP2 are measured as shown in FIG. 4(F). In this example, when the graph of the sound receiving results in the reproduction environment A shown in FIG. 4(E) and the graph of the sound receiving results in the reproduction environment B shown in FIG. 4(F) are compared, both the graphs do not exhibit the same characteristics, similar to the graphs of the sound receiving results shown in FIGS. 4(C) and 4(D), but can be corrected to exhibit closer characteristics than those of FIGS. 4(C) and 4(D).

In the invention, it is possible to allow the reproduction environment to approximate an ideal reproduction environment, regardless of the reproduction environment, since the sound field effect can be corrected according to the reproduction environment as described above. In addition, since, from the viewpoint of audio listening, the sound to which reflected sounds generated in the reproduction environment are added can be considered as "the original sound to which the sound field effect has not been imparted", the method of the invention can reduce a sense of discomfort or artificiality, using the amount of change when the sound field effect has been imparted.

The method of the invention also has an advantage in that costs or processing performance limitations are low, compared to the method in which a measurement environment is recreated, for example, using a process for suppressing reflected sounds in a reproduction environment, since, according to the method of the invention, it is possible to easily implement the means for measuring the respective proportions of the energy of the direct sound and the reflected sounds.

Figure 5:
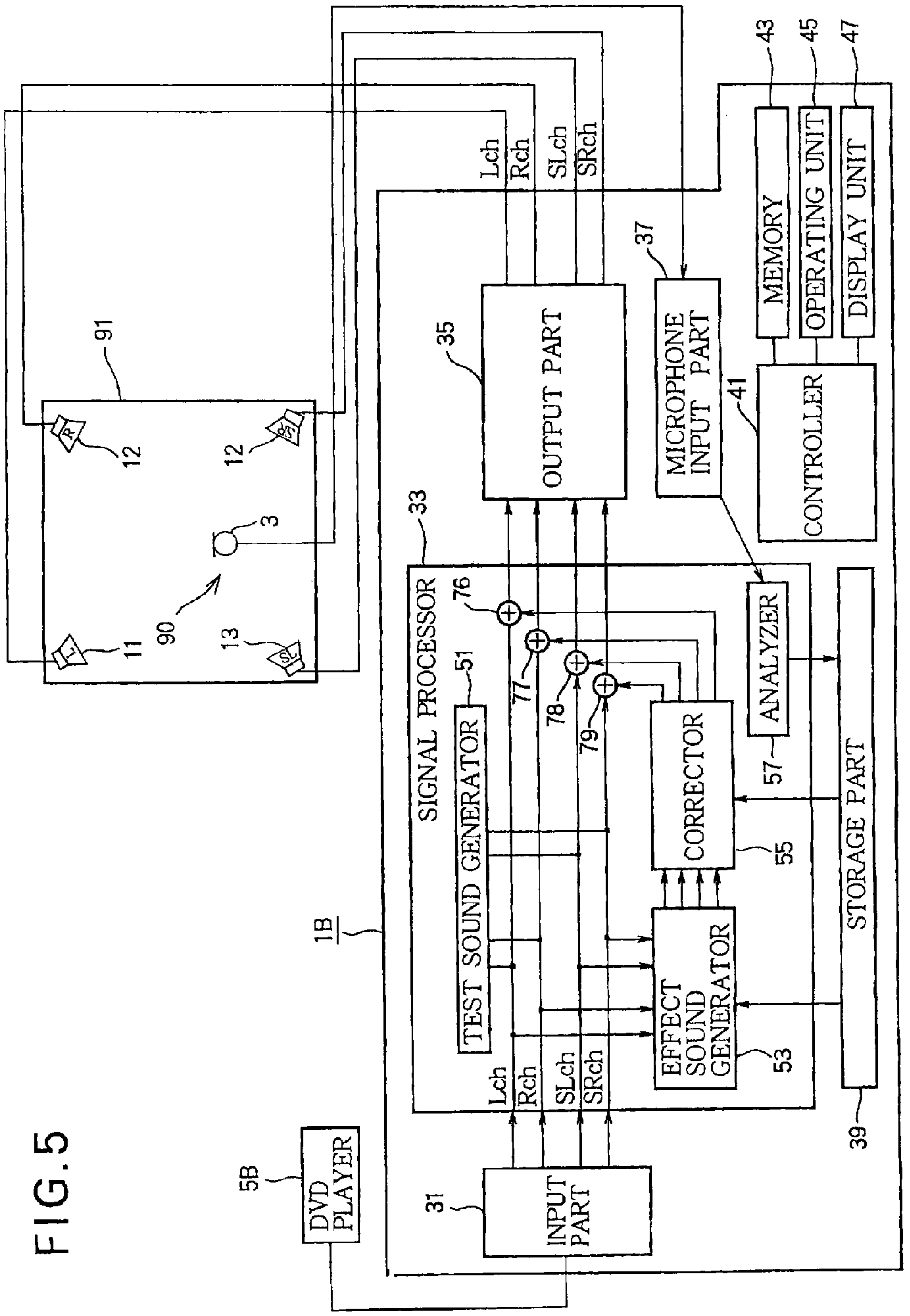
FIG. 5 illustrates building blocks of the sound field control device and an arrangement of speakers and a microphone.

The following is a detailed example of a configuration for emitting sound field effect sounds through a plurality of speakers in the sound field control device of the invention. FIG. 5 illustrates building blocks of the sound field control device and an arrangement of speakers and a microphone.

A sound field control device 1B shown in FIG. 5 includes a memory 43, an operating unit 45, and a display unit 47 connected to a controller 41 in addition to the components shown in FIG. 3. The memory 43 is a machine readable medium containing program instructions executed by a CPU constituting the controller 41. A DVD player 5B is connected as a content player 5 to an input part 31. For example, four speakers 11 to 14 are connected to an output part 35.

In a room 91, the speakers 11 to 14 are arranged around a listening position 90 to emit sounds toward the listening position 90 which is a sound receiving point. That is, the speaker 11 for a left channel (Lch) and the speaker 12 for a right channel (Rch) are installed at front left and right sides of the listening position 90, respectively. The speaker 13 for a left surround channel (SLch) and the speaker 14 for a right surround channel (SRch) are installed at rear left and right sides of the listening position 90, respectively. A microphone 3 is installed at the listening position 90.

Digital sound signals (PCM signals) of the four channels Lch, Rch, SLch, and SRch are input to an effect sound generator 53 and the effect sound generator 53 generates signals of sound field effect sounds for forming a sound field for virtual sound sources and outputs the generated signals to a corrector 55.

The corrector 55 corrects the signals of the sound field effect sounds from the effect sound generator 53, and adds and distributes the signals of sound field effect sounds for output through the speakers to generate and output respective signals of sound field effect sounds for the channels Lch, Rch, SLch, and SRch.

A signal processor 33 includes adders 76 to 79 which add the signals of the sound field effect sounds of the channels output by the corrector 55 to the signals of the channels input from the input part 31.

According to the configuration described above, it is possible to correct the sound field effect sounds for forming the sound field according to the reproduction environment.

Since the factor A and the correction factor B may be calculated for each speaker in each environment, a plurality of calculated values may be stored. For example, a total of 9 parameters such as factors A1 to A5 and correction factors B1 to B4 are present in the case where five speakers are used when performing adjustment in a previous adjustment environment when determining sound field effect information and four speakers are used as shown in FIG. 5 when performing reproduction through the sound field control device 1.

A plurality of factors or parameters may be handled using the following several methods.

(1) Setting of Representative Values of Factors A and Correction Factors B

In the case where a plurality of factors A and correction factors B are present, a representative value of factors A and a representative value of correction factors B are determined using several methods and the same correction is performed on all speakers. For example, an average or mean value may be employed as the representative value.

(2) Individual Correction of Factors A or Correction Factors B

In the case where output locations for recreating a specific virtual sound source when adjustment is performed are different from those when reproduction is performed, for example, in the case where an arrangement of speakers of the adjustment environment and an arrangement of speakers of the reproduction environment are different, the factors are individually corrected taking into consideration output locations in adjustment and output locations in reproduction for individual virtual sound sources.

(3) Setting of Representative Value of Factors A and Setting of Individual Correction Factors B for Each Virtual Sound Source or Each Output Location In this method, it is possible to balance complexity of processes and optimization of effects, taking into consideration the fact that it is easier to set conditions of the adjustment environment than to set conditions of the reproduction environment.

(4) Setting of Representative Values of Factors A and Correction Factors B Respectively for Front and Rear Sides of Listening Position For example, in a 5.1 channel surround system, speakers of channels Lch, Cch, and Rch (i.e., front speakers) are installed at the front side of the listening position and speakers of channels SLch and SRch (i.e., rear speakers) are installed at the rear side of the listening position. Here, it is possible to set a listening position at the middle between the front speakers and the rear speakers in an ideal reproduction environment such as a dedicated listening room. On the other hand, in the case where a surround system is installed in a living room, the listening position is often set near rear speakers due to constrains of arrangement of a table or a sofa in the living room. In this case, if the sound field effect is not adjusted, the listener perceives the sound field effect of the rear side more strongly than the sound field effect of the front side since the listener is closer to the rear speakers than the front speakers. Therefore, in this case, the factors A and the correction factors B may be changed respectively for the front speakers and the rear speakers. For example, in this case, if representative values of the factors A and the correction factors B are set for the three front speakers and representative values of the factors A and the correction factors B are set for the two rear speakers, it is possible to perform adjustment according to the listening position using a small number of adjustment parameters.

In the cases of (1) to (4), the controller 41, which corresponds to the determination part, calculates a representative value of factors A or a representative value of correction factors B from the factors A or the correction factors B and stores the representative values in the storage part 39. Then, the corrector 55 may be constructed to read the representative value of the factors A, the representative value of the correction factors B, or the individual values these values from the storage part 39 and to calculate the correction value C of the sound field effect using the read values.

It is possible to reduce calculation load or calculation time since it is possible to suppress the amount of processing for calculation by setting the representative values of the factors A or the correction factors B in the above manner.

In the sound field control device 1, measurement of the respective proportions of the direct sound and the reflected sounds in the reproduction environment may be performed once when the environment is established. In order to use the measurement results for the sound field effect processes, the measurement results may be stored in a nonvolatile memory (i.e., the storage part 39) included in the sound field control device 1.

The corrector 55 may be installed at the input side or the output side of the effect sound generator 53 in the case where only one representative value is set for each of the factors A and the correction factors B.

In the case where a plurality of factors A and correction factors B are present and correction is performed for each individual virtual sound source, the sound field control device may be constructed such that correction is performed for each individual virtual sound source before signal summation is performed for each speaker, which is an output location, at the effect sound generator 53 or the output part 35.

In the case where one representative value is used as the factor A and plural values are used as the correction factors B, the sound field control device may be constructed such that level correction is performed for each speaker, which is an output location, at the output side of the sound field effect processing block (i.e., the effect sound generator 53).

In the case where the correction factor $\sqrt{A/B}$ is significantly or even excessively great or small, it is possible to perform a process for limiting the correction factor $\sqrt{A/B}$ within a predetermined range, for example, to limit the range of values for correction factor using limit values or to introduce a function as a scale factor of the correction. That is, the sound field may be changed to one different from the assumed sound field since the "volumes" of the sound field effect sounds are corrected. This change may be limited within a predetermined range using a method of limiting the range of the correction factors or scaling the correction factors (for example, using a method of suppressing the increase of the correction factor as the correction factor increases). Accordingly, it is possible to prevent the occurrence of the processing problem that the sound field effect sound becomes greater than the direct sound.

As described above, the inventive sound field control device allows the actual reproduction environment to approximate the ideal reproduction environment, regardless of the nature of the actual reproduction environment, by correcting the volumes of the sound field effect sounds according to the nature of the reproduction environment.

What is claimed is:

1. A sound field control device comprising:
- an input part through which an audio signal is input;
- a storage part that stores a plurality of first factors in correspondence to a plurality of speakers in case that the plurality of the speakers are used to reproduce sound, wherein a first factor is obtained by calculating a proportion of energy of direct sound in total energy of sound collected in an adjustment environment within a predetermined time; and
- one or more processors configured to function as:
  - a sound field generation part that generates a sound field effect sound from the audio signal input through the input part and that outputs the sound field effect sound at a volume corresponding to the first factor,
  - a calculation part that calculates a plurality of second factors in correspondence to the plurality of speakers in case that the plurality of the speakers are used to reproduce sound, wherein a second factor represents a ratio of an energy of a direct sound to an energy of sound which is collected in a reproduction environment and which contains the direct sound, and
  - a correction part that corrects the volume of the sound field effect sound for each of the plurality of the speakers based on a plurality of ratios between the plurality of the first factors and the plurality of the second factors.

2. The sound field control device according to claim 1, wherein the correction part sets a limit to the ratio between the first factor and the second factor when correcting the volume of the sound field effect sound.

3. The sound field control device according to claim 1,
- wherein the one or more processors are further configured to function as a determination part that determines a representative value of the first factors in case that the first factors of the respective speakers are different, and that determines a representative value of the second factors in case that the second factors of the respective speakers are different, and
- wherein, when the determination part has determined the representative value, the correction part corrects the volume of the sound field effect sound generated by the sound field generation part using the representative value determined by the determination part.

4. The sound field control device according to claim 1, wherein the correction part corrects the volume of the sound field effect sound based on the ratio between the first factor and the second factor, such that the volume of the sound field effect sound decreases as the volume of the direct sound in the reproduction environment increases.

5. A sound field control device comprising:
- an input part through which an audio signal is input;
- a storage part that stores a first factor obtained by calculating a proportion of energy of direct sound in total energy of sound collected in an adjustment environment with a predetermined time;
- a microphone that is mountable at different positions respectively based on a listening position in a reproduction environment for collecting sound from a speaker; and
- one or more processors configured to function as:
  - a sound field generation part that generates a sound field effect sound from the audio signal input through the input part and that outputs the sound field effect sound at a volume corresponding to the first factor, a calculation part that calculates a second factor which represents a ratio of an energy of a direct sound to an energy of sound which is collected in the reproduction environment and which contains the direct sound, a correction part that corrects the volume of the sound field effect sound based on a ratio between the first factor and the second factor, and an analyzer part that analyzes the sound collected by the microphone at the different positions and that generates parameters associated to energy of the collected sound, wherein the calculation part calculates the second factor according to the parameters generated by the analyzer part.

6. The sound field control device according to claim 5, wherein the microphone is mounted at a first position for collecting a first sound from the speaker, and also mounted at a second position near the first position for collecting a second sound from the speaker, wherein the analyzer part analyzes the first sound and the second sound and obtains parameters including a distance $R_1$ between the first position of the microphone and the speaker, a distance $R_2$ between the second position of the microphone and the speaker, a sound pressure $P_1$ measured at the first position, a sound pressure $P_2$ measured at the second position, a sound pressure $P_r$ measured when either of the first or second sound has reached a steady state, and wherein the calculation part calculates the second factor according to the parameters $R_1$, $R_2$, $P_l$, $P_2$ and $P_r$.

* * * * *